United States Patent
Huang et al.

(10) Patent No.: US 8,507,946 B2
(45) Date of Patent: Aug. 13, 2013

(54) ELECTROSTATIC DISCHARGE PROTECTION DEVICE

(75) Inventors: Yeh-Jen Huang, Hsinchu (TW);
Yeh-Ning Jou, Taipei County (TW);
Ming-Dou Ker, Hsinchu County (TW);
Wen-Yi Chen, Taipei (TW); Chia-Wei Hung, Nantou County (TW); Hwa-Chyi Chiou, Hsinchu (TW)

(73) Assignees: Vanguard International Semiconductor Corporation, Hsinchu (TW); National Chiao Tung University, Hsinchu (TW)

( * ) Notice: Subject to any disclaimer, the term of this patent is extended or adjusted under 35 U.S.C. 154(b) by 166 days.

(21) Appl. No.: 13/040,415

(22) Filed: Mar. 4, 2011

(65) Prior Publication Data

US 2012/0146151 A1 Jun. 14, 2012

(30) Foreign Application Priority Data

Dec. 14, 2010 (TW) ................................ 99143641 A

(51) Int. Cl.
*H01L 29/74* (2006.01)
*H01L 31/111* (2006.01)
*H01L 23/62* (2006.01)

(52) U.S. Cl.
USPC ....... 257/173; 257/360; 257/362; 257/E27.11

(58) Field of Classification Search
USPC ................. 257/355, 356, 360, 362, 173, 175, 257/401, E27.11; 361/56
See application file for complete search history.

(56) References Cited

U.S. PATENT DOCUMENTS

| | | | | |
|---|---|---|---|---|
| 5,714,784 | A * | 2/1998 | Ker et al. | 257/360 |
| 6,002,156 | A * | 12/1999 | Lin | 257/356 |
| 6,316,805 | B1 | 11/2001 | Lin et al. | |
| 6,392,860 | B1 | 5/2002 | Lin et al. | |
| 6,576,958 | B2 * | 6/2003 | Ker et al. | 257/355 |
| 6,794,715 | B1 * | 9/2004 | Liu et al. | 257/346 |
| 7,473,974 | B2 * | 1/2009 | Furuta | 257/360 |
| 2007/0145418 | A1 * | 6/2007 | Ker et al. | 257/213 |

FOREIGN PATENT DOCUMENTS

TW 502459 9/2002

* cited by examiner

*Primary Examiner* — Shouxiang Hu

(74) *Attorney, Agent, or Firm* — Birch, Stewart, Kolasch & Birch, LLP

(57) ABSTRACT

An electrostatic discharge (ESD) protection device including a substrate, a first doped region, a second doped region, and a third doped region, a gate and a plurality of contacts is disclosed. The substrate includes a first conductive type. The first doped region is formed in the substrate and includes a second conductive type. The second doped region is formed in the substrate and includes the second conductive type. The third doped region is formed in the substrate, includes the first conductive type and is located between the first and the second doped regions. The gate is formed on the substrate, located between the first and the second doped regions and comprises a first through hole. The contacts pass through the first through hole to contact with the third doped region.

11 Claims, 8 Drawing Sheets

ELECTROSTATIC DISCHARGE PROTECTION DEVICE

CROSS REFERENCE TO RELATED APPLICATIONS

This Application claims priority of Taiwan Patent Application No. 99143641, filed on Dec. 14, 2010, the entirety of which is incorporated by reference herein.

BACKGROUND OF THE INVENTION

1. Field of the Invention

The invention relates to a protection device, and more particularly to an electrostatic discharge (ESD) protection device.

2. Description of the Related Art

Generally, each integrated circuit (IC) comprises at least one input terminal and at least one output terminal. When the input terminal receives high voltage electrostatic charges and the output terminal is grounded, the electrostatic charges passes through the IC and is released to the ground. The release process is referred to as an ESD event. The ability of electrostatic discharge is not plenty. However, ESD energy is great due to the high voltage. If the electrostatic discharge is not processed, the IC will be damaged.

As semiconductor manufacturing evolves, ESD protection has become one of the most critical reliability issues for integrated circuits (IC). Several ESD test modes, such as machine mode (MM) or human body mode (HBM), have been proposed to imitate the circumstances under which an ESD event may occur. The ability to withstand certain ESD levels is essential for successful commercialization of ICs.

BRIEF SUMMARY OF THE INVENTION

In accordance with an embodiment, an electrostatic discharge (ESD) protection device comprises a substrate, a first doped region, a second doped region, a third doped region, a gate and a plurality of contacts. The substrate comprises a first conductive type. The first doped region is formed in the substrate and comprises a second conductive type. The second doped region is formed in the substrate and comprises the second conductive type. The third doped region is formed in the substrate, comprises the first conductive type and is located between the first and the second doped regions. The gate is formed on the substrate, located between the first and the second doped regions and comprises a first through hole. The contacts pass through the first through hole to contact with the third doped region.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
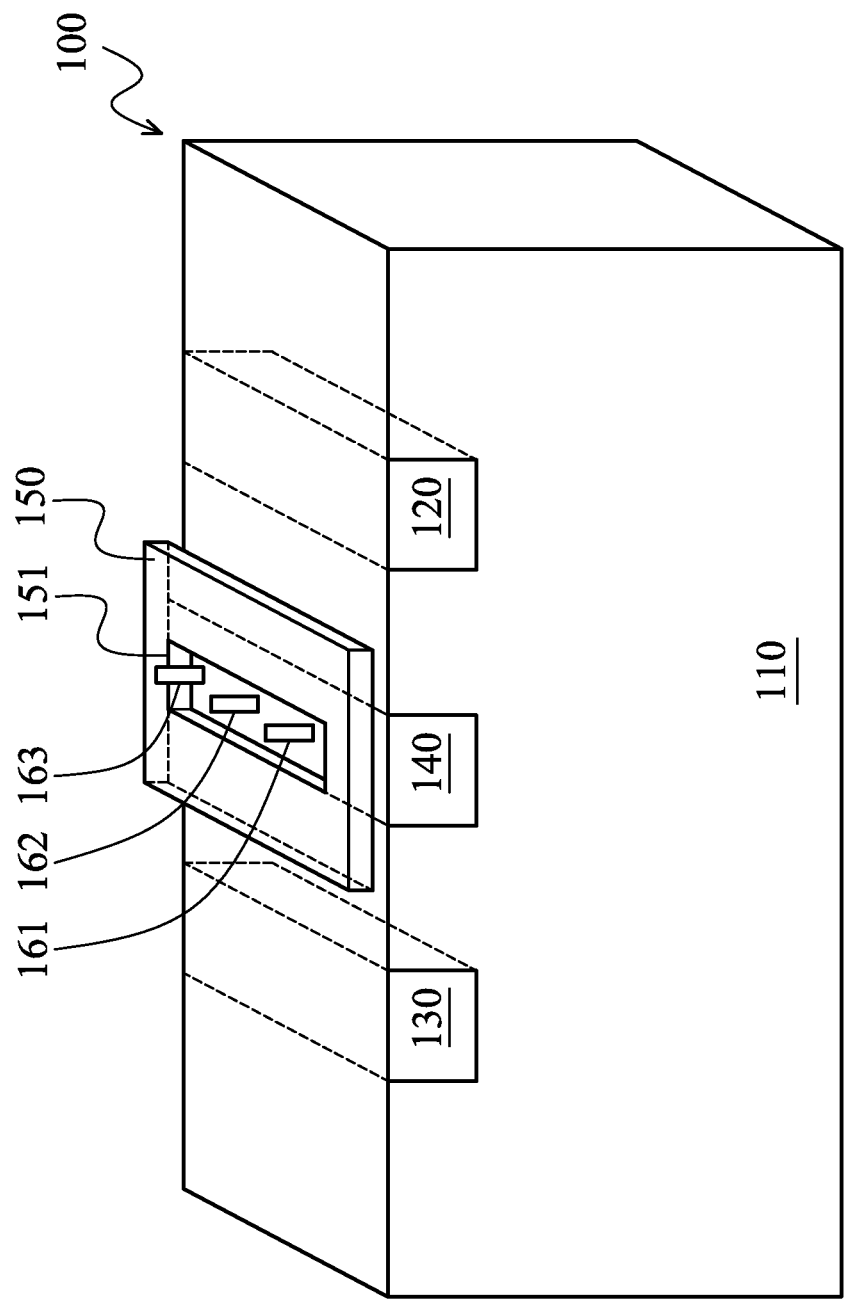
FIG. 1A is a schematic diagram of an exemplary embodiment of an ESD protection device of the invention.

FIG. 1A is a schematic diagram of an exemplary embodiment of an ESD protection device of the invention. The ESD protection device 100 comprises a substrate 110, doped regions 120, 130, 140, a gate 150 and contacts 161~163. The substrate 110 comprises a first conductive type. The first conductive type is a P-type or a N-type.

The doped regions 120, 130 and 140 are formed in the substrate 110. In this embodiment, each of the doped regions 120 and 130 comprises a second conductive type. The doped region 140 is located between the doped regions 120 and 130 and comprises the first conductive type. In this embodiment, the second conductive type is different from the first conductive type. In one embodiment, the first conductive is a P-type, and the second conductive type is a N-type. In another embodiment, the first conductive type is a N-type, and the second conductive type is a P-type.

The gate 150 is formed on the substrate 110 and is located between the doped regions 120 and 130. In this embodiment, the gate comprises a through hole 151. The through hole 151 shows a portion of the doped region 140. A multitude of contacts (e.g. 161~163) pass through the through hole 151 to contact with the doped region 140. In this embodiment, the gate 150 is isolated from the contacts (e.g. 161~163).

The invention does not limit the shape of the through hole 151, the size of the through hole 151 and the amount of the through hole 151. In this embodiment, the gate 150 only comprises a through hole 151. The through hole 151 is a closed region, but the disclosure is not limited thereto. In this embodiment, the through hole 151 is formed into the shape of a rectangle. In another embodiment, the through hole 151 is formed into the shape of a square, into the shape of a circle or into other shapes. In other embodiments, the gate 150 comprises a multitude of through holes. The shapes of the through holes are the same or are different. The sizes of the through holes are the same or are different.

Further, the invention does not limit the amount and the arrangement of the contacts passing through the through hole 151. For clarity, only three contacts 161~163 are shown in FIG. 1A. In other embodiments, at least one contact passes through the through hole 151. Additionally, the contacts 161~163 are arranged into a straight line. In other embodiments, the contacts passing through the through hole 151 are arranged into other shapes.

Figure 1B:
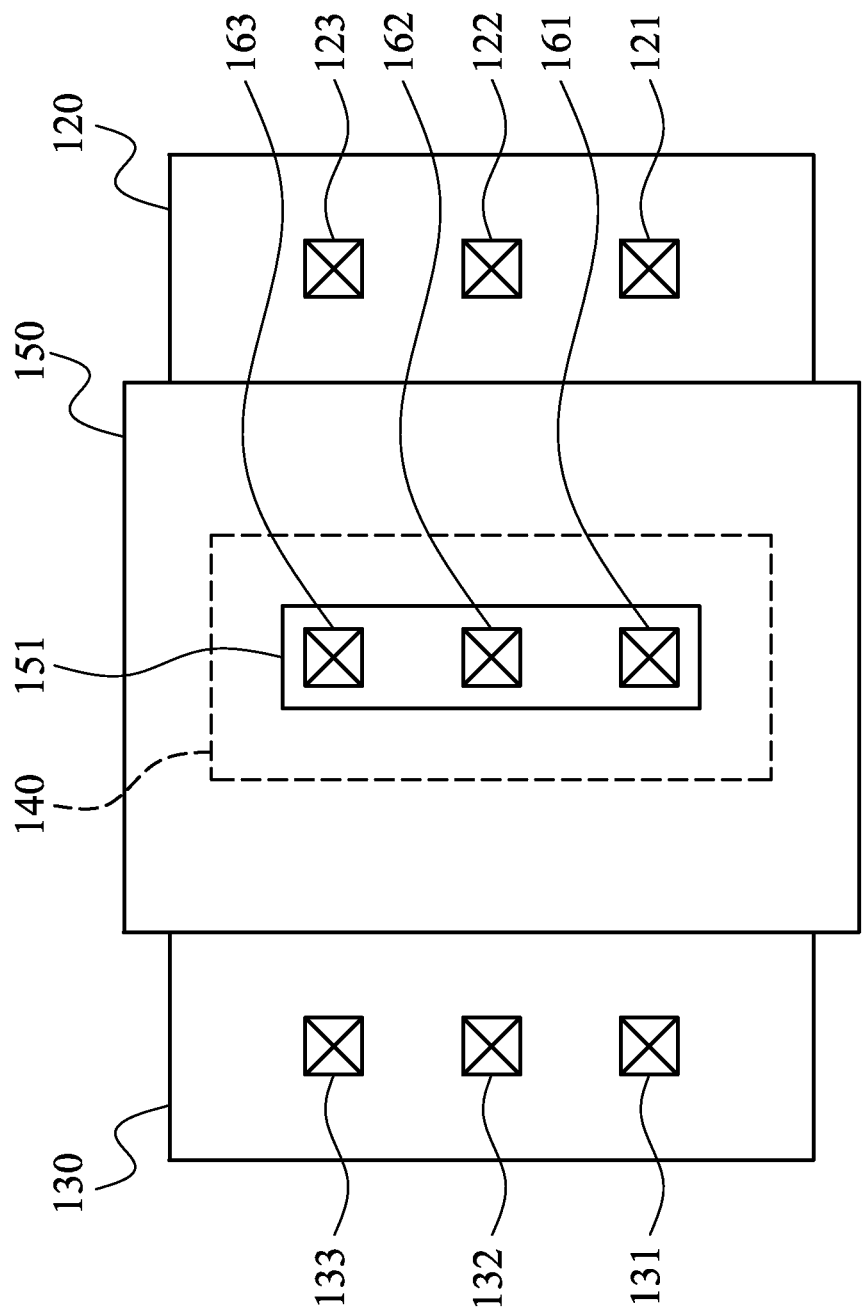
FIG. 1B is a top-view of an exemplary embodiment of a portion of the ESD protection device shown in FIG. 1A.

FIG. 1B is a top-view of a portion of the ESD protection device shown in FIG. 1A. The contacts 161~163 pass through the through hole 151 of the gate 150 to contact with the doped region 140. In this embodiment, the doped region 120 comprises contacts 121~123, and the doped region 130 comprises contacts 131~133.

The doped regions 120, 130 and 140 contact external conductive lines via the contacts 121~123, 131~133 and 161~163. The arrangements of the contacts 121~123 and 131~133 are the same as the arrangement of the contacts 161~163, but the disclosure is not limited thereto. In other embodiments, the arrangements of the contacts 121~123, 131~133 and 161~163 are different.

Figure 1C:
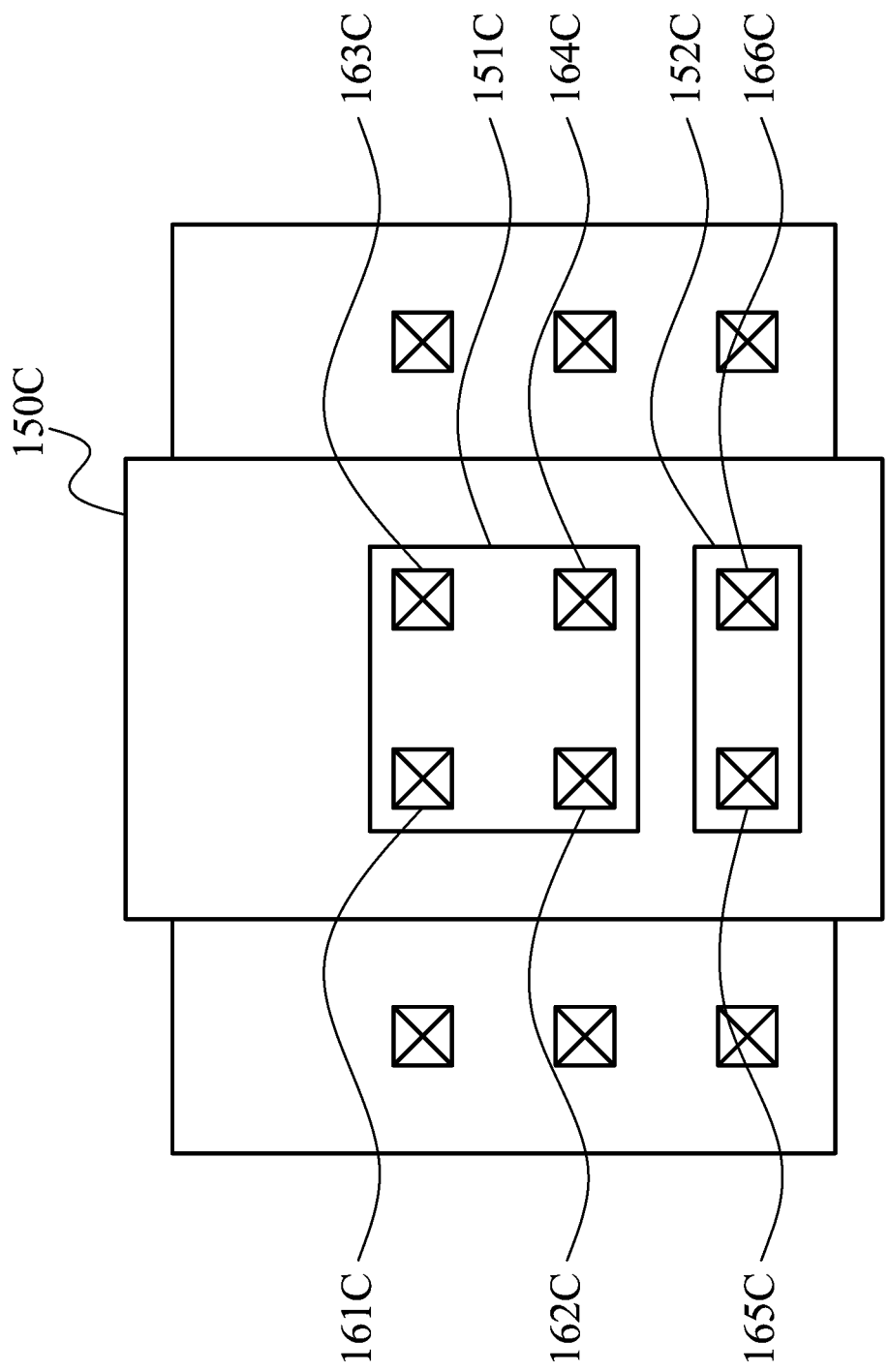
FIGS. 1C~1E are top-views of other exemplary embodiments of a portion of the ESD protection device shown in FIG. 1A.

FIG. 1C is a top-view of an exemplary embodiment of a gate of the invention. The gate 150C comprises through holes 151C and 152C. The shape of the through hole 151C is different from the shape of the through hole 152C. The size of the through hole 151C is different from the size of the through hole 152C. In this embodiment, the through hole 151C is formed into the shape of a square, and the through hole 152C is formed into the shape of a rectangle.

The amount of contacts passing through the through hole 151C exceeds the amount of contacts passing through the through hole 152C. In this embodiment, the contacts 161C~164C pass through the through hole 151C, and the contacts 165C~166C pass through the through hole 152C. The contacts 161C~166C contact the same doped region.

Figure 1D:
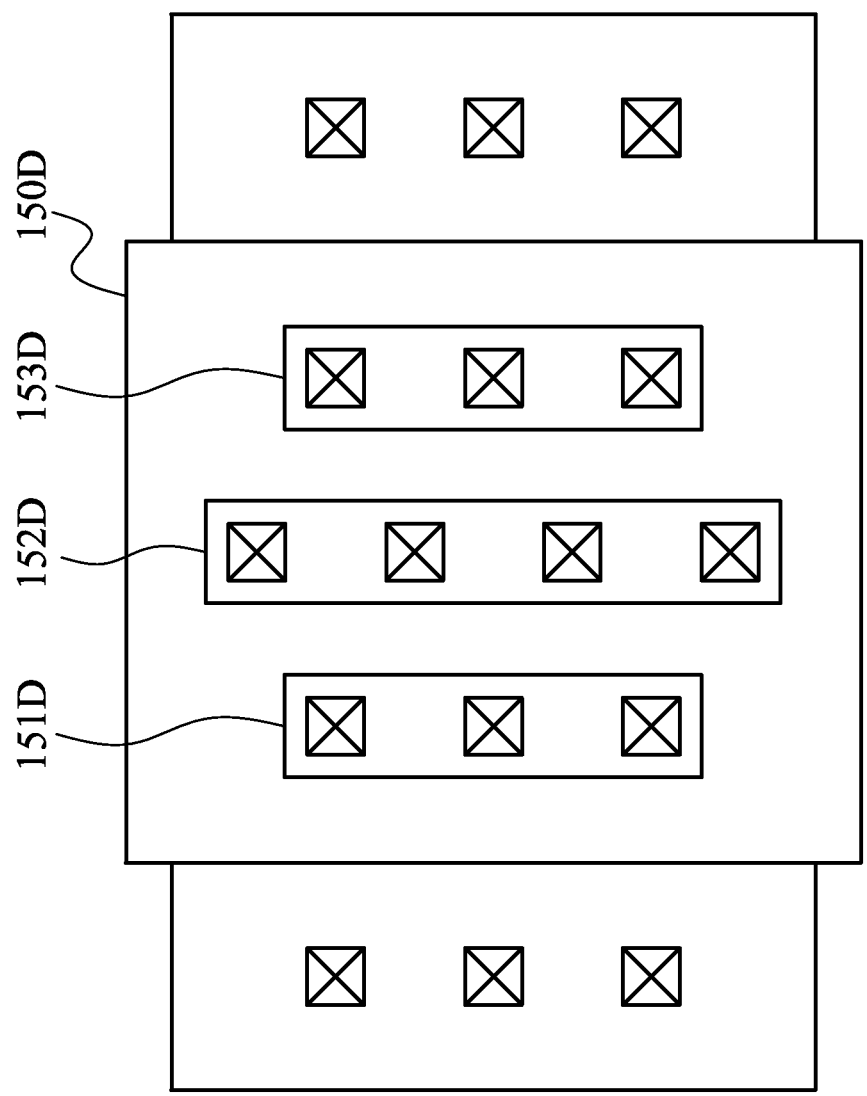

FIG. 1D is a top-view of another exemplary embodiment of a gate of the invention. The gate 150D comprises through holes 151D~153D. The shapes of the through holes 151D~153D are the same, but the size of the through hole 152D is different from the size of each of the through holes 151D and 153D. The amount of contacts passing through the through hole 152D exceeds the amount of contacts passing through the through holes 151D or 153D.

Figure 1E:
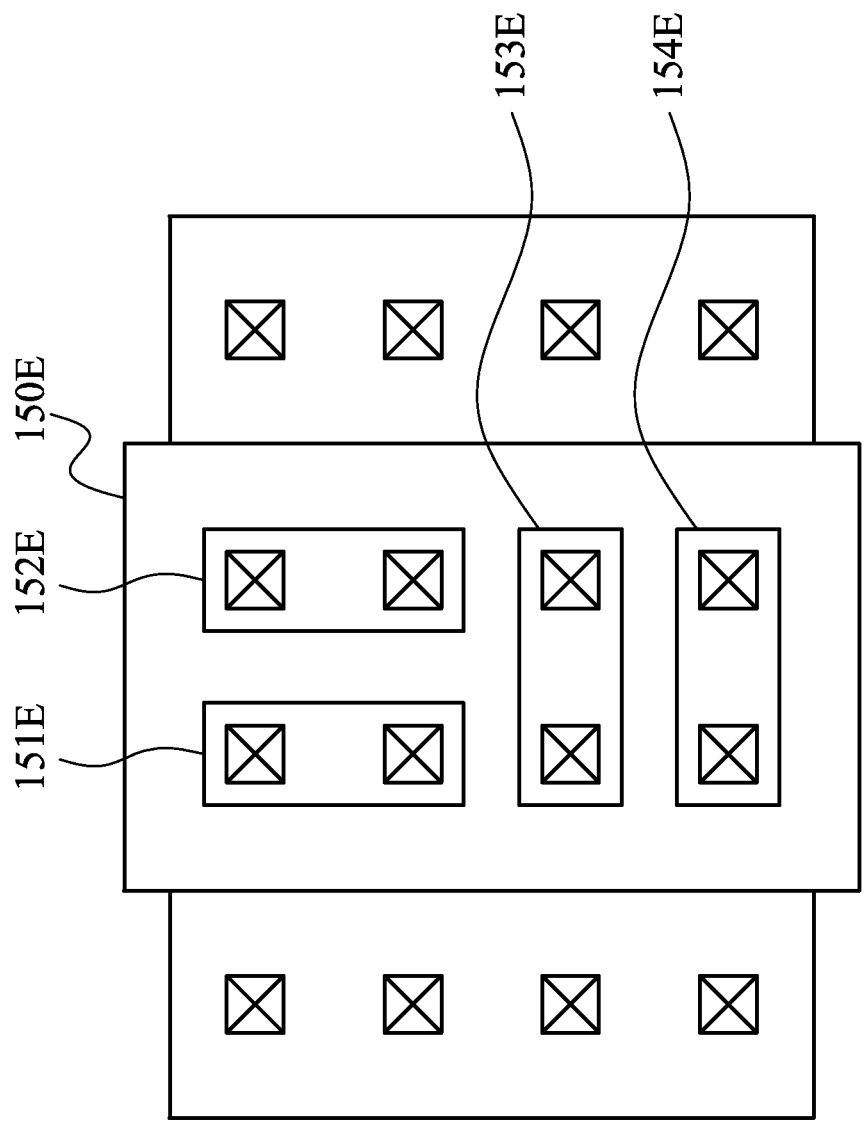

FIG. 1E is a top-view of another exemplary embodiment of a gate of the invention. The gate 150E comprises through holes 151E~154E. The through holes 151E~154E have similar shapes. The amount of contacts of the through holes 151E~154E are the same. In this embodiment, the arrangement of the contacts passing through the through hole 151E is the same as the arrangement of the contacts passing through the through hole 152E. The arrangement of the contacts passing through the through hole 151E is different from the arrangement of the contacts passing through one of the through holes 153E and 154E.

The ESD protection device of the invention comprises a gate. The gate comprises at least one through hole. A multitude of contacts pass through the through hole to contact a doped region formed under the gate. Thus, the holding voltage of the ESD protection device is increased. The invention does not limit the amount, the shape and the size of the through hole. The invention does not limit the arrangement and the amount of the contacts.

Figure 2:
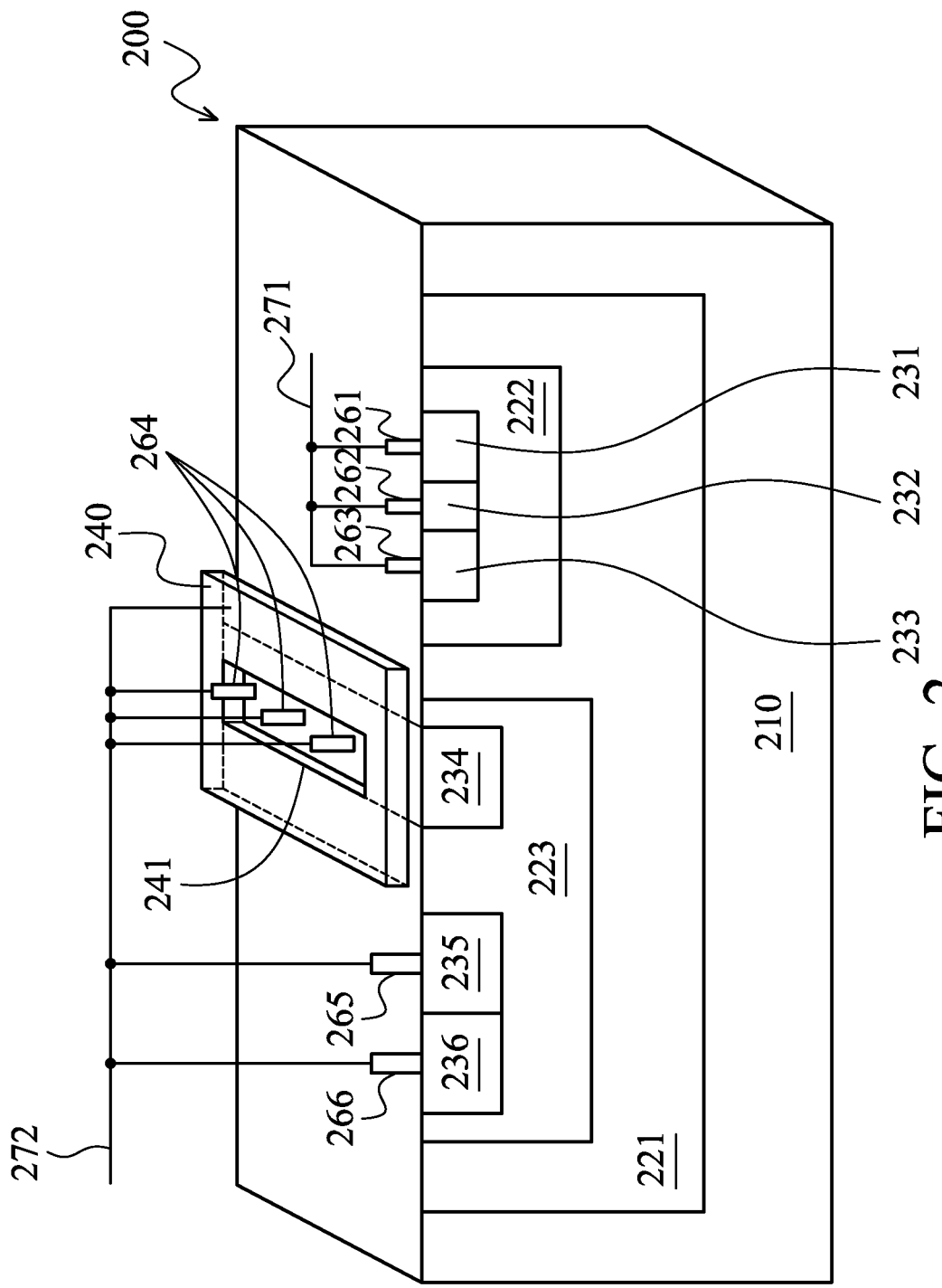
FIGS. 2~4 are schematic diagrams of other exemplary embodiments of an ESD protection device of the invention

FIG. 2 is a schematic diagram of another exemplary embodiment of an ESD protection device. The ESD protection device 200 comprises a substrate 210, doped regions 221~223, 231~236 and a gate 240. The positions of the substrate 210, the doped regions 221~223, 231~236 and the gate 240 are shown in FIG. 2, thus, descriptions of the positions of the substrate 210, the doped regions 221~223, 231~236 and the gate 240 are omitted for brevity.

In one embodiment, the conductive type of each of the substrate 210 and the doped regions 223, 232, 234 and 236 is a P-type, and the conductive type of each of the doped regions 221, 222, 231, 233 and 235 is a N-type. Thus, the ESD protection device 200 is referred to as a N-type silicon controlled rectifier (NSCR) operated in a high voltage system. In another embodiment, the conductive type of each of the substrate 210 and the doped regions 223, 232, 234 and 236 is a N-type, and the conductive type of each of the doped regions 221, 222, 231, 233 and 235 is a P-type. Thus, the ESD protection device 200 is referred to as a P-type silicon controlled rectifier (PSCR).

Taking the NSCR as an example, the doped region 221 is a high voltage N-type well (HVNW), the doped region 222 is a N-type drain drift (NDD) region, and the doped region 223 is a P-type body (P_Body). The doping concentrations of the doped regions 231~236 are high.

In this embodiment, the doped region 234 contacts the conductive line 272 via the contact 264. The contact 264 passes through the through hole 241 of the gate 240. Additionally, the doped region 235 contacts the conductive line 272 via the contact 265, and the doped region 236 contacts the conductive line 272 via the contact 266. The doped regions 231~233 contacts the conductive line 271 via the contacts 261~263.

When an ESD event occurs in the conductive line 271 and the conductive line 272 is grounded, the ESD protection device 200 releases ESD current to ground. In this embodiment, the holding voltage of the ESD protection device 200 is increased because the through hole 241 passes by the contacts 264.

Figure 3:
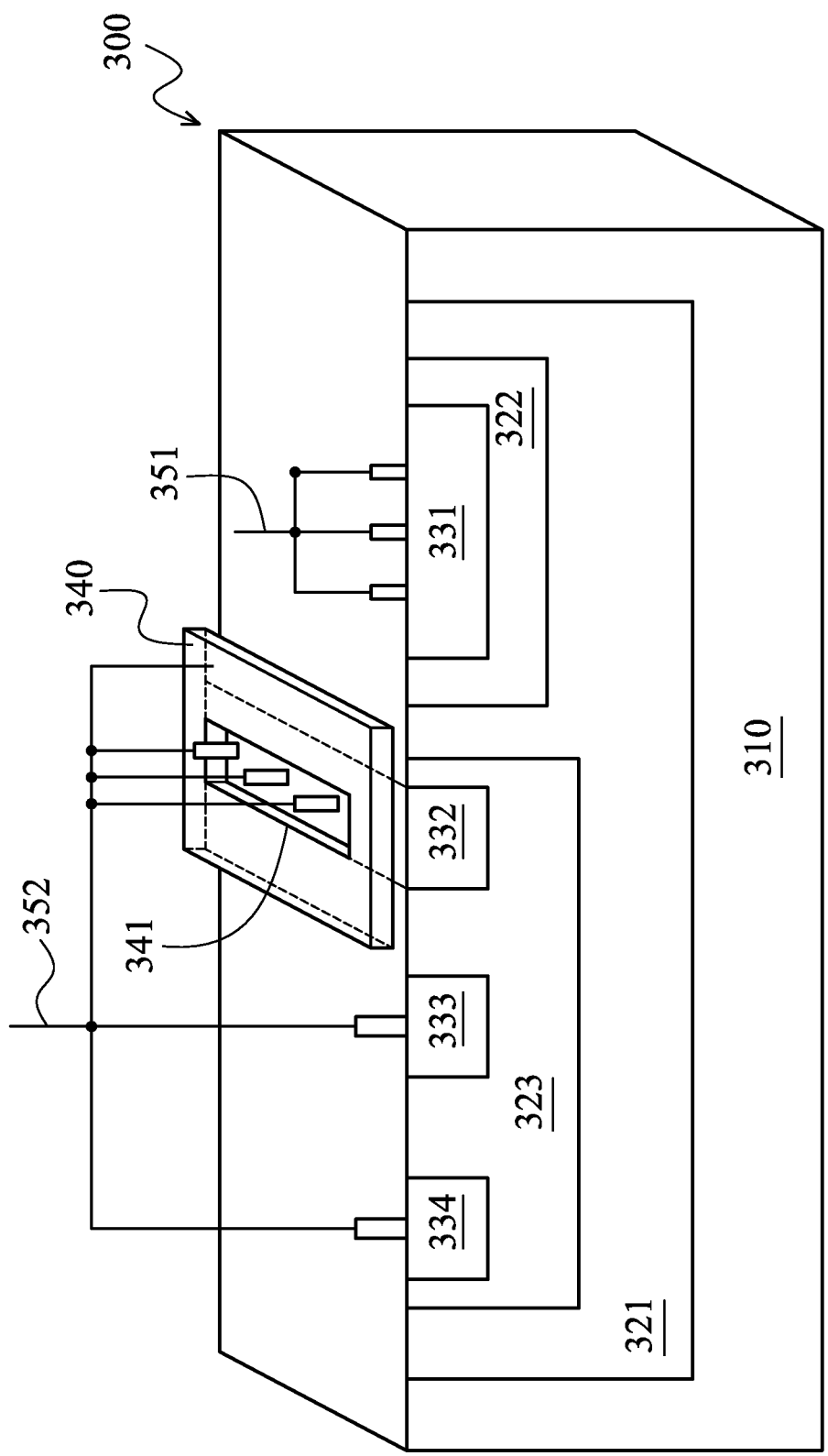

FIG. 3 is a schematic diagram of another exemplary embodiment of an ESD protection device. The ESD protection device 300 comprises a substrate 310, doped regions 321~323, 331~334 and a gate 340. The positions of the substrate 310, the doped regions 321~323, 331~334 and the gate 340 are shown in FIG. 3, thus, descriptions of the positions of the substrate 310, the doped regions 321~323, 331~334 and the gate 340 are omitted for brevity.

In one embodiment, the conductive type of each of the substrate 310 and the doped regions 323, 332 and 334 is a P-type, and the conductive type of each of the doped regions 321, 322, 331 and 333 is a N-type. Thus, the ESD protection device 300 is a NMOS transistor. In another embodiment, the conductive type of each of the substrate 310 and the doped regions 323, 332 and 334 is a N-type, and the conductive type of each of the doped regions 321, 322, 331 and 333 is a P-type. Thus, the ESD protection device 300 is a PMOS transistor.

Taking the NMOS transistor as an example, the doped region 321 is a HVNW, the doped region 322 is a NDD region, and the doped region 323 is a P_Body. The doped region 331 connects to the conductive line 351 via the contacts. The doped regions 332~334 connect to the conductive line 352 via the contacts When an ESD event occurs in the conductive line 351 and the conductive line 352 is grounded, the ESD protection device 300 releases ESD current to ground. In this embodiment, the holding voltage of the ESD protection device 300 is increased because the doped region 332 connects to the conductive line 352 via a multitude of contacts.

Figure 4:
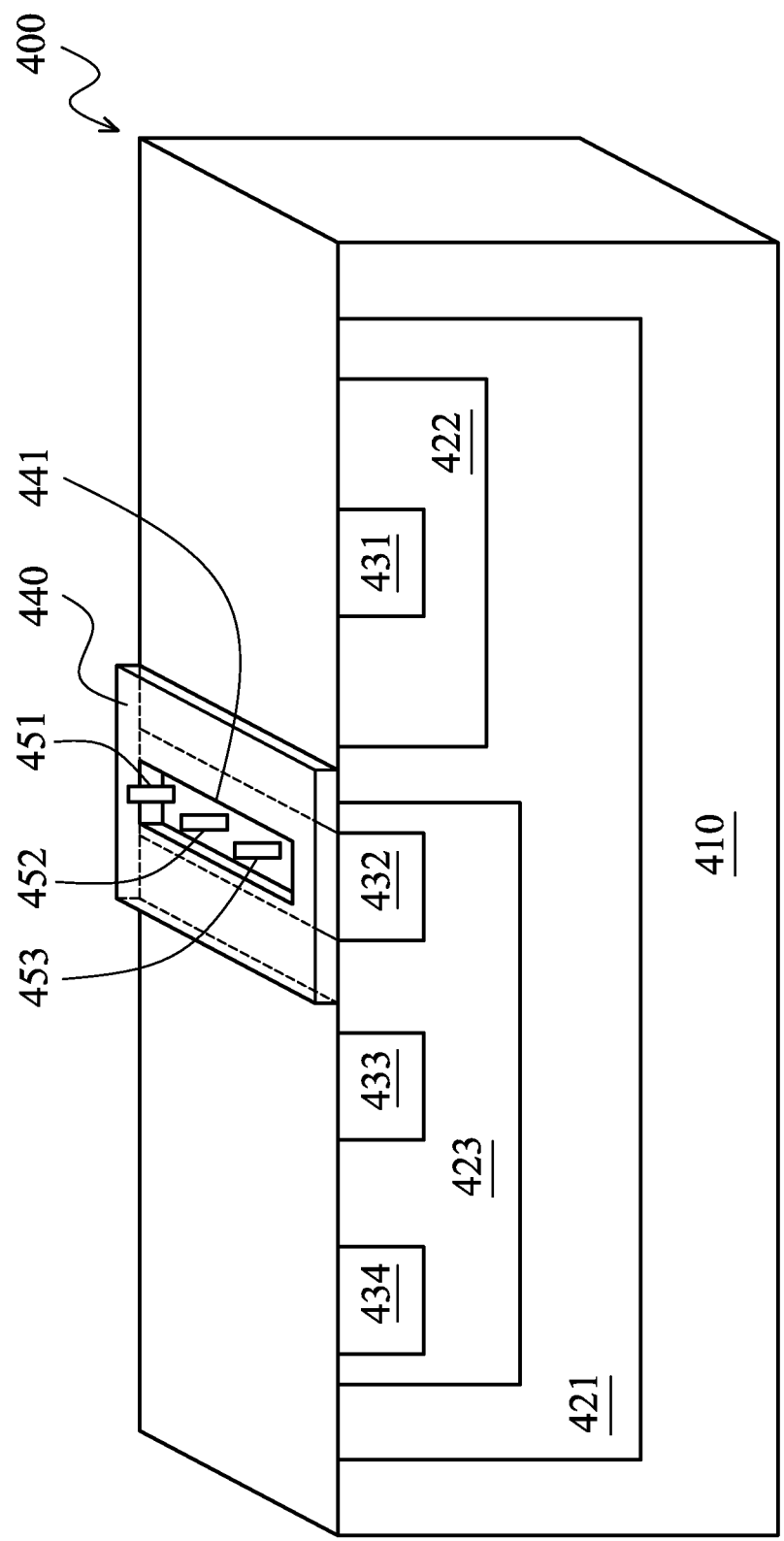

FIG. 4 is a schematic diagram of another exemplary embodiment of an ESD protection device. The ESD protection device 400 is an insulated gate bipolar transistor (IGBT). The ESD protection device 400 comprises a substrate 410, doped regions 421~423, 431~434 and a gate 440.

In this embodiment, the conductive type of each of the substrate 410 and the doped regions 423, 431, 432 and 434 is a P-type, and the conductive type of each of the doped regions 421, 422 and 433 is a N-type. In one embodiment, the doped region 421 is a HVNW, the doped region 422 is a NDD, and the doped region 423 is a P_Body.

The gate 440 comprises a through hole 441. The through hole 441 passes by the contacts 451~453 to contact with the doped region 432. The holding voltage of the ESD protection device 400 is increased because the contacts 451~453 pass through the through hole 441.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) protection device, comprising:
    a substrate comprising a first conductive type;
    a first doped region formed in the substrate and comprising a second conductive type, wherein the first and the second conductive types are opposite conductive types;
    a second doped region formed in the substrate and comprising the second conductive type;
    a third doped region formed in the substrate, comprising the first conductive type and located between and separated from the first and the second doped regions;
    a gate formed on an area of the substrate between the first and the second doped regions and comprising a first through hole and a second through hole, wherein the first and the second through holes are both formed within a same contiguous layer for the gate; and
    a plurality of separated first contacts passing through the first through hole to directly contact with the third doped region,
    wherein the same contiguous layer comprises a first closed loop and a second closed loop defining the first and second through holes respectively.

2. The ESD protection device as claimed in claim 1, wherein the first through hole is a closed region.

3. The ESD protection device as claimed in claim 1, wherein the size of the second through hole is equal to the size of the first through hole.

4. The ESD protection device as claimed in claim 1, wherein the size of the second through hole is not equal to the size of the first through hole.

5. The ESD protection device as claimed in claim 4, further comprising:
    a plurality of second contacts passing through the second through hole to contact with the third doped region.

6. The ESD protection device as claimed in claim 5, wherein the amount of the second contacts is higher than or less than the amount of the first contacts.

7. The ESD protection device as claimed in claim 5, wherein the arrangement of the second contacts is different from the arrangement of the first contacts.

8. The ESD protection device as claimed in claim 4, wherein the shape of the second through hole is different from the shape of the first through hole.

9. The ESD protection device as claimed in claim 1, wherein the first contacts is isolated from the gate.

10. The ESD protection device as claimed in claim 1, wherein the first conductive type is a P-type, and the second conductive type is a N-type.

11. The ESD protection device as claimed in claim 1, wherein the first and the second through holes are separated from each other.

* * * * *